(12) United States Patent
Chan et al.

(10) Patent No.: US 9,852,938 B1
(45) Date of Patent: Dec. 26, 2017

(54) PASSIVATED GERMANIUM-ON-INSULATOR LATERAL BIPOLAR TRANSISTORS

(71) Applicant: International Business Machines Corporation, Armonk, NY (US)

(72) Inventors: Kevin K. Chan, Staten Island, NY (US); Tak H. Ning, Yorktwon Heights, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/231,087

(22) Filed: Aug. 8, 2016

(51) Int. Cl.
| | |
|---|---|
| *H01L 21/762* | (2006.01) |
| *H01L 21/02* | (2006.01) |
| *H01L 29/10* | (2006.01) |
| *H01L 29/73* | (2006.01) |
| *H01L 29/66* | (2006.01) |
| *H01L 21/306* | (2006.01) |
| *H01L 21/3065* | (2006.01) |

(52) U.S. Cl.
CPC ...... *H01L 21/7624* (2013.01); *H01L 21/0245* (2013.01); *H01L 21/02488* (2013.01); *H01L 21/02502* (2013.01); *H01L 21/02532* (2013.01); *H01L 21/02598* (2013.01); *H01L 21/76283* (2013.01); *H01L 29/1008* (2013.01); *H01L 29/6625* (2013.01); *H01L 29/66265* (2013.01); *H01L 29/7317* (2013.01); *H01L 21/0228* (2013.01); *H01L 21/02271* (2013.01); *H01L 21/3065* (2013.01); *H01L 21/30604* (2013.01)

(58) Field of Classification Search
CPC .......... H01L 21/0245; H01L 21/02488; H01L 21/02502; H01L 21/02532; H01L 21/7624; H01L 21/76283
See application file for complete search history.

(56) References Cited

U.S. PATENT DOCUMENTS

| | | | | |
|---|---|---|---|---|
| 8,288,758 | B2 * | 10/2012 | Ning | H01L 29/0808 257/19 |
| 8,558,282 | B1 * | 10/2013 | Cai | H01L 29/6625 257/197 |
| 9,305,964 | B1 * | 4/2016 | Leobandung | H01L 25/041 |
| 9,461,139 | B1 * | 10/2016 | Liu | H01L 29/6625 |
| 2008/0146017 | A1 * | 6/2008 | Kato | H01L 21/76224 438/618 |

(Continued)

OTHER PUBLICATIONS

Yau, J. et al., "SiGe-on-Insulator Symmetric Lateral Bipolar Transistors", IEEE Conference, Oct. 5-8, 2015, pp. 1-2.

(Continued)

*Primary Examiner* — Christine Enad
(74) *Attorney, Agent, or Firm* — Scully, Scott, Murphy & Presser, P.C.; Louis J. Percello, Esq.

(57) ABSTRACT

After forming an epitaxial germanium layer over a germanium-on-insulator substrate including an insulator layer and a doped germanium layer overlying the insulator layer, the doped germanium layer is selectively removed and a passivation layer is formed within a space between the epitaxial germanium layer and the insulator layer that is formed by removal of the doped germanium layer. A lateral bipolar transistor is subsequently formed in the epitaxial germanium layer.

19 Claims, 5 Drawing Sheets

(56) References Cited

U.S. PATENT DOCUMENTS

2015/0263095 A1* 9/2015 Chan .................. H01L 29/155
257/17

OTHER PUBLICATIONS

Kuzum, D. et al., "Ge-Interface Engineering With Ozone Oxidation for Low Interface-State Density", IEEE Electron Device Letters, Apr. 2008, vol. 29, Issue 4, pp. 328-330.

Gao, F. et al., "Surface passivation using ultrathin AlNx film for Ge-metal-oxide-semiconductor devices with hafnium oxide gate dielectric", Applied Physics Letters, vol. 86, Issue 11, 2005, pp. 113501-1 to 113501-3.

Lee, C., et al., "High-Electron-Mobility Ge/GeO2 n-MOSFETs With Two-Step Oxidation", IEEE Transactions on Electron Devices, vol. 58, No. 5, May 2011, pp. 1295-1301.

Cai, J. et al., "SOI lateral bipolar transistor with drive current >3mA/μm", 2013 IEEE SOI-3D-Subthreshold Microelectronics Technology Unified Conference (S3S), Oct. 7-10, 2013, pp. 1-2.

Sugawara, T. et al., "Electrical properties of germanium/metal-oxide gate stacks with atomic layer deposition grown hafnium-dioxide and plasma-synthesized interface layers", Applied Physics Letters, vol. 90, 2007, pp. 112912-1 to 112912-3.

Kim, K. et al., "Atomic layer deposition of insulating nitride interfacial layers for germanium metal oxide semiconductor field effect transistors with high-κ oxide/tungsten nitride gate stacks", Applied Physics Letters, vol. 90, 2007, pp. 212104-1 to 212104-3.

Fukuda, Y. et al., "Low-Temperature Formation of High-Quality GeO2 Interlayer for High-k Gate Dielectrics/Ge by Electron-Cyclotron-Resonance Plasma Techniques", IEEE Transactions on Electron Devices, vol. 57, No. 1, Jan. 2010, pp. 282-287.

* cited by examiner

PASSIVATED GERMANIUM-ON-INSULATOR LATERAL BIPOLAR TRANSISTORS

BACKGROUND

The present application relates to lateral bipolar transistors, and more particularly, to germanium-based lateral bipolar transistors.

Germanium has a narrower band gap than silicon, and provides a great potential for providing a fast lateral bipolar transistor that operates at low voltages. A silicon-based lateral bipolar transistor typically operates at about 1 V, while a germanium-based lateral bipolar transistor typically operates at about 0.6 V. However, the base current in the germanium-based device is observed to be relatively high due to the recombination at the germanium/insulator interface within the emitter-base space charge region which is caused by interface defects. Therefore, there remains a need to reduce germanium/insulator interface defects for developing high performance germanium-based lateral bipolar transistors.

SUMMARY

A germanium-based lateral bipolar transistor is formed employing a germanium-on-insulator (GOI) substrate with a passivated germanium/insulator interface. After forming an epitaxial germanium layer over a GOI substrate including an insulator layer and a doped germanium layer overlying the insulator layer, the doped germanium layer is selectively removed and a passivation layer is formed within a space between the epitaxial germanium layer and the insulator layer that is formed by removal of the doped germanium layer. Due to the reduced interface defects at the interface between the epitaxial germanium layer and the passivation layer, a lateral bipolar transistor formed in the epitaxial germanium layer exhibits high drive current and high current gain at a low base-emitter voltage.

According to an aspect of the present application, a semiconductor structure is provided. The semiconductor structure includes a passivation layer located on an insulator layer, an epitaxial germanium portion located on the passivation layer and including an intrinsic base region that contains dopants of a first conductivity type, an emitter region that laterally contacts a first side of the intrinsic base region and contains dopants of a second conductivity type that is the opposite type of the first conductivity type, and a collector region that laterally contacts a second side of the intrinsic base region opposite the first side and contains dopants of the second conductivity type, and an extrinsic base region vertically contacting the intrinsic base region and including dopants of the first conductivity type.

According to another aspect of the present application, a method of forming a semiconductor structure is provided. The method includes first providing a germanium-on-insulator (GOI) substrate including, from bottom to top, a handle substrate, a buried insulator layer and a doped germanium layer. An epitaxial germanium layer is then formed on the doped germanium layer. After forming a trench extending through the epitaxial germanium layer and the doped germanium layer to expose sidewalls of a doped germanium portion and an epitaxial germanium portion, the doped germanium portion is removed. A space is formed between the epitaxial germanium portion and the buried insulator layer. Next, a passivation layer is formed to fill the space.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
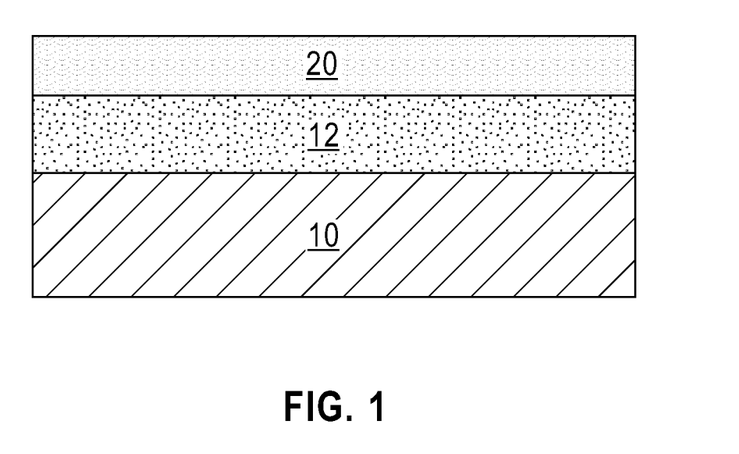
FIG. 1 is a vertical cross-sectional view of an exemplary semiconductor structure after providing a germanium-on-insulator (GOI) substrate including a handle layer, a buried insulator layer and a doped germanium layer according to an embodiment of the present application.

Referring to FIG. 1, an exemplary semiconductor structure according to an embodiment of the present application can be formed by providing a germanium-on-insulator (GOI) substrate. The GOI substrate can include a stack of, from bottom to top, a handle substrate 10, a buried insulator layer 12 contacting a top surface of the handle substrate 10, and a doped germanium layer 20 contacting a top surface of the buried insulator layer 12.

The handle substrate 10 may include a semiconductor material such as, for example, silicon, a silicon-germanium alloy, a silicon-germanium-carbon alloy, a silicon-carbon alloy, an III-V compound semiconductor, an II-VI compound semiconductor, or any combinations thereof. Multilayers of semiconductor materials can also be used as the semiconductor material of the handle substrate 10. In one embodiment, the handle substrate 10 is composed of single crystalline Si. The thickness of the handle substrate 10 can be from 50 µm to 2 mm, although lesser and greater thicknesses can also be employed.

The buried insulator layer 12 may include a dielectric material such as silicon dioxide, silicon nitride, silicon oxynitride, boron nitride, or a combination thereof. The thickness of the buried insulator layer 12 can be from 50 nm to 200 nm, although lesser and greater thicknesses can also be employed. The buried insulator layer 12 may, or may not, include multiple dielectric layers, e.g., a stack including at least a silicon dioxide layer and a silicon nitride layer.

The doped germanium layer 20 can include a single crystalline germanium material that extends across the entirety of the buried insulator layer 12. In one embodiment, the doped germanium layer 20 can consist essentially of germanium. The thickness of the doped germanium layer 20 can be from 5 nm to 300 nm, although lesser and greater thicknesses can also be employed.

The doped germanium layer 20 can contain dopants such as, for example, phosphorous, arsenic, antimony, boron, aluminum, gallium, indium, thallium, or nitrogen. The dopant content should be sufficient such that there is high etch selectivity between the doped germanium layer 20 and an epitaxial germanium layer subsequently formed thereon. For example, the dopant concentration in the doped germanium layer 20 can be greater than $1 \times 10^{17}$ atoms/cm$^3$.

Figure 2:
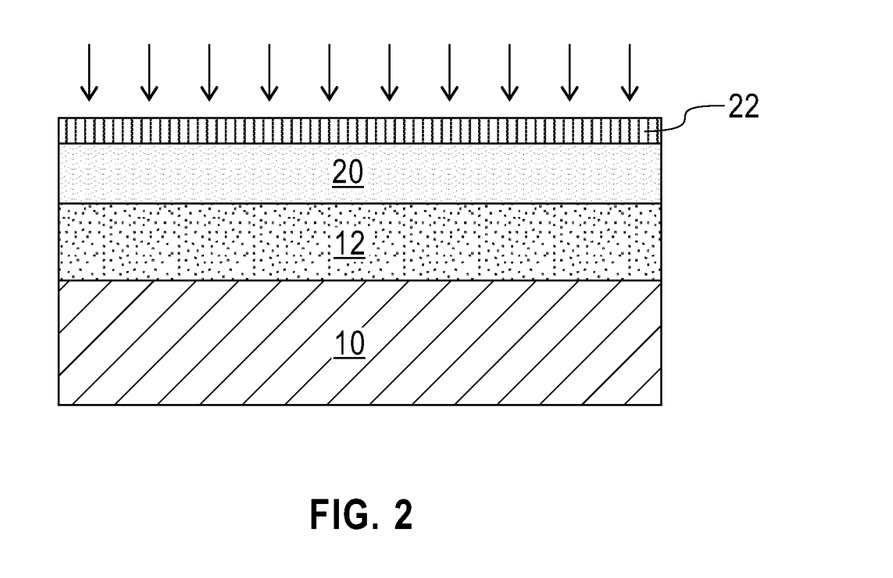
FIG. 2 is a vertical cross-sectional view of the exemplary semiconductor structure after doping an intrinsic germanium layer in a GOI substrate to provide the doped germanium layer.

In one embodiment and as shown in FIG. 2, if the germanium layer as provided in the GOI substrate is an intrinsic germanium layer (not shown), the intrinsic germanium layer can be doped by first applying a dielectric mask layer 22 over a top surface of the intrinsic germanium layer. An ion implantation is then performed to introduce dopants into the intrinsic germanium layer, forming the doped germanium layer 20. The dielectric mask layer 22 protects the underlying intrinsic germanium layer from damage by ion impact during ion implantation. The dielectric mask layer 22 may include a dielectric oxide such as silicon dioxide. The thickness of the dielectric mask layer 22 may be from about 5 nm to about 200 nm, although lesser and greater thicknesses can also be employed. The dielectric mask layer 22 may be formed by chemical vapor deposition (CVD), physical vapor deposition (PVD), plasma enhanced chemical vapor deposition (PECVD) or atomic layer deposition (ALD). After ion implantation, the dielectric mask layer 22 can be removed, for example, by oxygen plasma.

Figure 3:
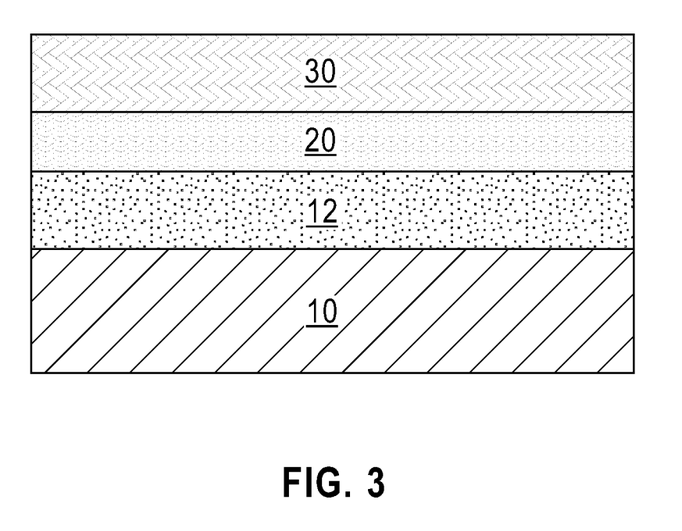
FIG. 3 is a vertical cross-sectional view of the exemplary semiconductor structure of FIG. 1 after forming an epitaxial germanium layer on the doped germanium layer.

Referring to FIG. 3, an epitaxial germanium layer 30 is formed over the doped germanium layer 20 utilizing any suitable epitaxial growth (or deposition) process. The term "epitaxial growth or deposition" means the growth of a semiconductor material on a deposition surface of a semiconductor material, in which the semiconductor material being grown has the same crystalline characteristics as the semiconductor material of the deposition surface. The epitaxial germanium layer 30 thus has the same crystalline characteristics as that of the underlying germanium layer 20.

For example, in instances where the doped germanium layer 20 as provided in the GOI substrate is composed of single crystalline germanium, the epitaxial germanium layer 30 formed thereupon is composed of single crystalline germanium. In one embodiment, the epitaxial germanium layer 30 may be formed by CVD or molecular beam epitaxy (MBE). Exemplary gases that can be employed used as a source of germanium include, but are not limited to, germane (GeH$_4$) and germane tetrachloride (GeCl$_4$). The epitaxial germanium layer 30 as deposited is essentially undoped. As used herein, the term "essentially undoped" means a dopant concentration in a doped semiconductor layer is less than $1 \times 10^{15}$ atoms/cm$^3$. The thickness of the epitaxial germanium layer 30 that is formed can be from 20 nm to 100 nm, although lesser and greater thicknesses can also be employed.

Figure 4:
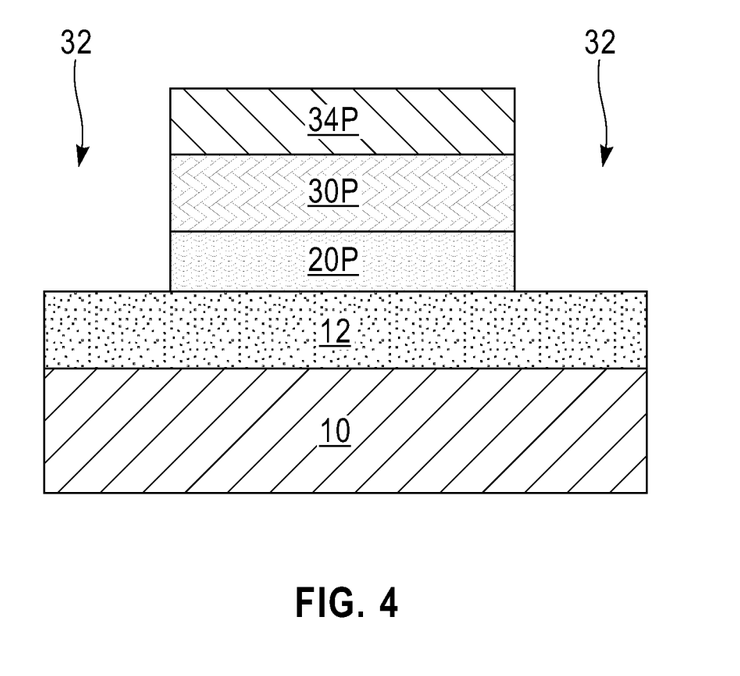
FIG. 4 is a vertical cross-sectional view of the exemplary semiconductor structure of FIG. 3 after forming a hard mask layer over the epitaxial germanium layer and then forming a trench in the hard mask layer, the epitaxial germanium layer and the doped germanium layer to define a hard mask portion, an epitaxial germanium portion and a doped germanium portion.

Referring to FIG. 4, a hard mask layer (not shown) is formed over the epitaxial germanium layer 30. The hard mask layer may include an oxide, nitride or an oxynitride. In one embodiment, the hard mask material that can be used in providing the hard mask layer can be comprised of silicon nitride. The hard mask layer may be formed by a deposition process such as, for example, CVD, PVD, PECVD or ALD. The thickness of the hard mask layer may be from 5 nm to 200 nm, although lesser and greater thicknesses can also be employed.

A trench 32 is subsequently formed extending through the hard mask layer, the epitaxial germanium layer 30 and the doped germanium layer 20 such that the top surface of the buried insulator layer 12 is exposed at the bottom of the trench 32. The trench 32 can be formed by lithography and etching. For example, a photoresist layer (not shown) is first applied on a top surface of the hard mask layer and lithographically patterned to form an opening therein. The pattern of the opening in the photoresist layer is then transferred into the hard mask layer by an anisotropic etch. The anisotropic etch can be a dry etch such as, for example, reactive ion etch (RIE) or a wet etch involving a chemical etchant that removes material of the hard mask layer selective to the semiconductor materials of the epitaxial germanium layer 30 and the doped germanium layer 20. A remaining portion of the hard mask layer after the lithographic patterning constitutes a hard mask portion 34P. Another anisotropic etch is then performed to pattern the epitaxial germanium layer 30 and the doped germanium layer 20 using the hard mask portion 34P as an etch mask. A remaining portion of the epitaxial germanium layer 30 is herein referred to as an epitaxial germanium portion 30P. A remaining portion of the doped germanium layer 20 is herein referred to as a doped germanium portion 20P. The patterned photoresist layer is subsequently removed, for example, by oxygen ashing.

Figure 5:
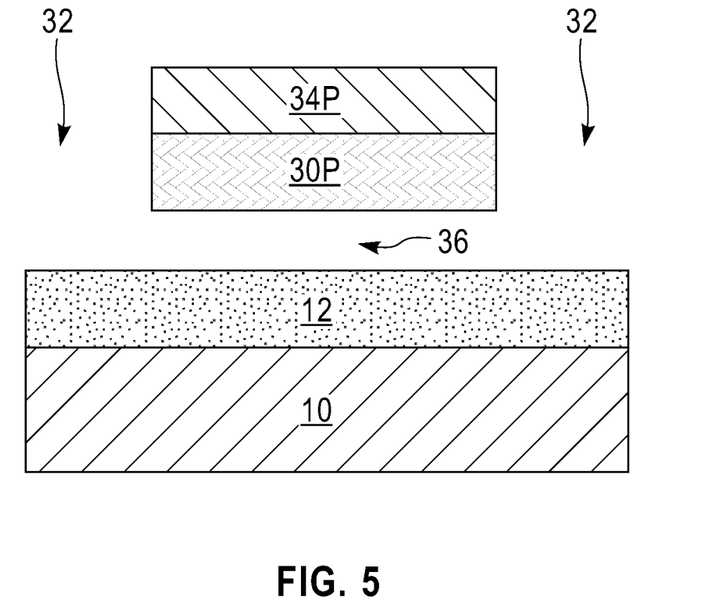
FIG. 5 is a vertical cross-sectional view of the exemplary semiconductor structure of FIG. 4 after removing the doped germanium portion to provide a space between the epitaxial germanium portion and the buried insulator layer.

Referring to FIG. 5, the doped germanium portion 20P is removed using a selective etching process that etches the doped germanium portion 20P selective to the epitaxial germanium portion 30P, the hard mask portion 34P and the buried insulator layer 12. The selective etching process can be a dry etch such as RIE or wet etch using a chemical etchant such as, for example, potassium hydroxide (KOH), ammonium tetramethyl hydroxide (ATMH) or ammonium hydroxide (NH$_4$OH). The removal of the doped germanium portion 20P creates a space 36 between the epitaxial germanium portion 30P and the buried insulator layer 12.

Figure 6:
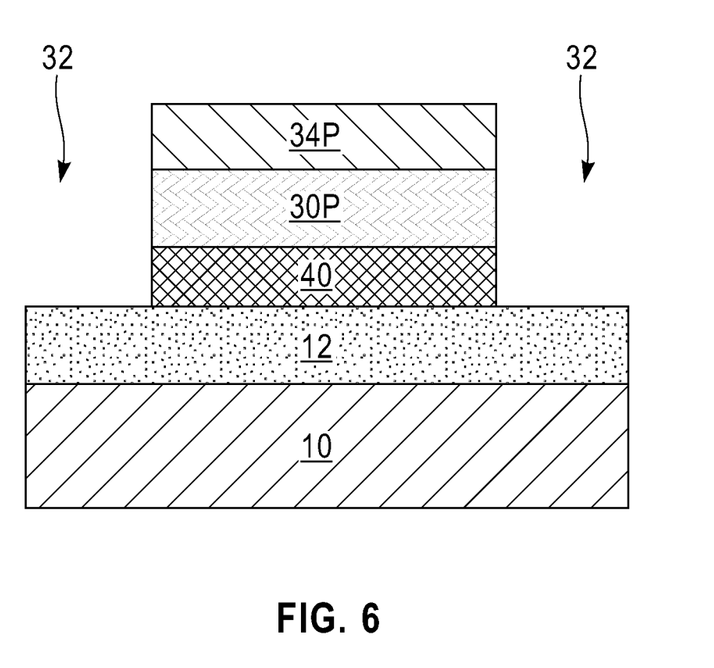
FIG. 6 is a vertical cross-sectional view of the exemplary semiconductor structure of FIG. 5 after forming a passivation layer to completely fill the space.

Referring to FIG. 6, the space 36 is filled with a dielectric material, thus forming a passivation layer 40 between the epitaxial germanium portion 30P and the buried insulator layer 12. The dielectric material that can be employed to fill the space 36 includes, but is not limited to aluminum oxide, silicon dioxide, silicon nitride, silicon oxynitride, tantalum oxynitride, aluminum nitride, hafnium oxide and hafnium nitride. The filling process can be performed by a deposition process (e.g., CVD or ALD) followed by an etch back process (e.g., wet etch, dry etch or combination of both) to remove the dielectric material from areas other than the space region. The thickness of the passivation layer 40 thus formed is substantially the same as the thickness of the doped germanium portion 20P. In some embodiments of the present application, the etch process only removes a portion of the passivation layer 40 that is present on the top surface of the hard mask portion 34P, the passivation layer 40 thus formed are present within the space 36 and on the sidewalls of the epitaxial germanium portion 30P (not shown).

Figure 7:
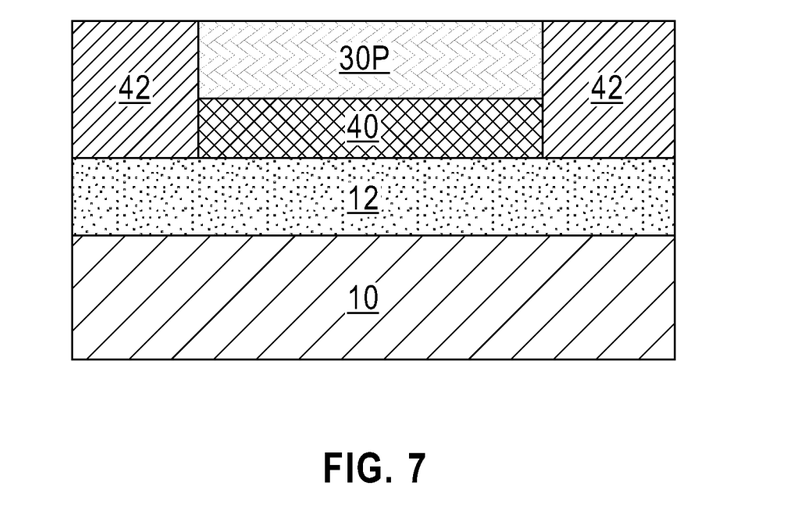
FIG. 7 is a vertical cross-sectional view of the exemplary semiconductor structure of FIG. 6 after forming a trench isolation structure within the trench and removing the hard mask portion from a top surface of the epitaxial germanium portion.

Referring to FIG. 7, the trench 32 is filled with a dielectric material such as silicon oxide, silicon nitride, and/or silicon oxynitride. A trench isolation structure 42 is thereby formed within the trench 32, laterally surrounding the epitaxial germanium portion 30P and the passivation layer 40. The dielectric material can be deposited, for example, by CVD. The top surface of the trench isolation structure 42 can be coplanar with, raised above, or recessed below, the top surface of the epitaxial germanium portion 30P. Subsequently, a chemical mechanical planarization (CMP) process is performed to remove the hard mask portion 34P.

Figure 8:
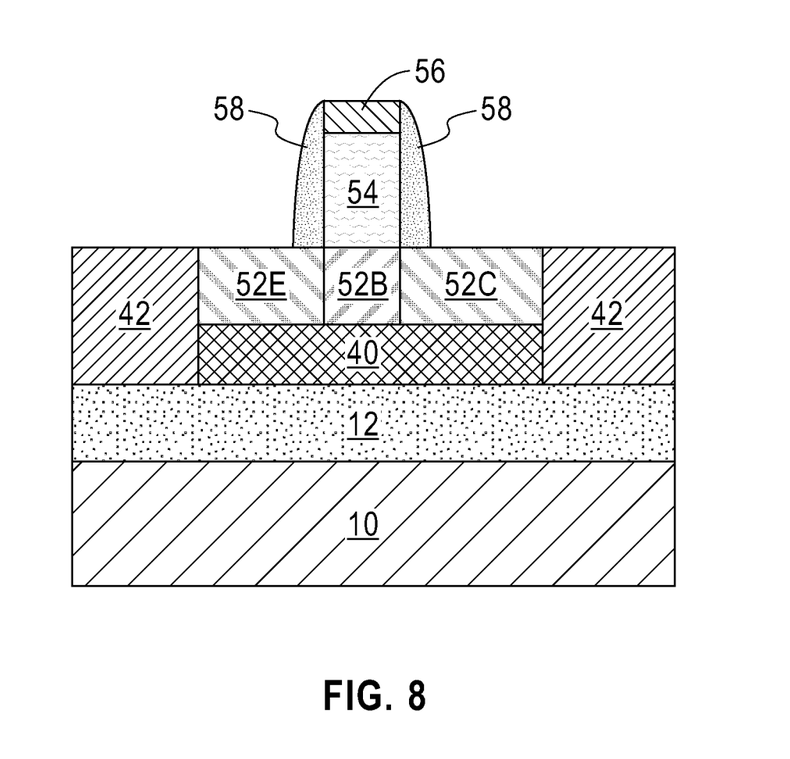
FIG. 8 is a vertical cross-sectional view of the exemplary semiconductor structure of FIG. 7 after forming a lateral bipolar transistor.

Referring to FIG. 8, a lateral bipolar transistor is formed. The lateral bipolar transistor includes an intrinsic base region 52B, an emitter region 52E and a collector region 52C disposed within the epitaxial germanium portion 30P. The intrinsic base region 52B includes dopants of a first conductivity type which can be p-type or n-type. The emitter region 52E laterally contacts a first side of the intrinsic base region 52B and includes dopants of a second conductivity type that is the opposite type of the first conductivity type. The collector region 52C laterally contacts a second side of the intrinsic base region 52B opposite to the first side and includes dopants of the second conductivity type. The lateral bipolar transistor also includes an extrinsic base region 54 in contact with a top surface of the intrinsic base region 52B and including dopants of the first conductivity type. The extrinsic base region 54 is doped to a greater extent than the intrinsic base region 52B. In some embodiments of the present application, the lateral bipolar transistor further includes a dielectric base cap 56 present on top of the extrinsic base region 54 and a dielectric spacer 58 present on sidewalls of a vertical stack of the extrinsic base region 54 and the dielectric base cap 56.

The lateral bipolar transistor can be fabricated using techniques known in the art. For example, an ion implantation can be first performed to dope the epitaxial germanium portion 30P with dopants of the first conductivity type. The first conductivity type can be p-type or n-type. Exemplary p-type dopants include, but are not limited to, boron, aluminum, gallium and indium. Exemplary n-type dopants include, but are not limited to, antimony, arsenic and phosphorous. The dopant concentration in the epitaxial germanium region 30P can be from $1 \times 10^{17}$ atoms/cm3 to $5 \times 10^{19}$ atoms/cm$^3$, although lesser and greater dopant concentrations can also be employed.

Next, an extrinsic base layer and a dielectric base cap layer (not shown) are sequentially deposited over the epitaxial germanium portion 30P and the trench isolation structure 42 and lithographically patterned to form a stack, from bottom to top, of the extrinsic base region 54 and the dielectric base cap 56.

The extrinsic base layer can be a doped semiconductor material layer having a doping of the first conductivity type. The semiconductor material of the extrinsic base layer, and consequently, the semiconductor material of the extrinsic base region 54 derived there from, can be any doped semiconductor material having dopants of the first conductivity type. For example, the extrinsic base layer can include doped silicon, a doped silicon-germanium alloy, a doped silicon-carbon alloy, or a doped silicon-germanium-carbon alloy.

The extrinsic base layer can be deposited, for example, by CVD or MBE. As deposited, the extrinsic base layer can be polycrystalline, amorphous or epitaxially aligned with the epitaxial germanium portion 30P. If the extrinsic base layer is amorphous as deposited, the amorphous material can be converted into a polycrystalline material in the subsequent thermal processing step (such as an activation anneal after formation of emitter and collector regions). The thickness of the extrinsic base layer can be from 10 nm to 200 nm, although lesser and greater thicknesses can also be employed.

The extrinsic base layer contains dopants of the first conductivity. In one embodiment, the extrinsic base layer can be deposited with in-situ doping that incorporates dopants of the first conductivity type during deposition. In another embodiment, the extrinsic base layer can be deposited as an intrinsic semiconductor material and subsequently doped with dopants of the first conductivity type. The doping of the intrinsic semiconductor material can be performed, for example, by ion implantation, gas phase doping, plasma doping, or diffusion of electrical dopants from a disposable dopant source layer (such as a phosphosilicate glass layer, a borosilicate glass layer, or an arsenosilicate glass layer). The dopant concentration in the extrinsic base layer is greater than the dopant concentration in the epitaxial germanium portion 30P and can be from $5 \times 10^{19}$ atoms/cm$^3$ to $5 \times 10^{21}$ atoms/cm$^3$, although lesser and greater dopant concentrations can also be employed.

The dielectric base cap layer includes a dielectric material such as silicon oxide, silicon nitride, silicon oxynitride, a dielectric metal oxide, or a combination thereof. The dielectric base cap layer can be deposited, for example, by CVD or PECVD. The thickness of the dielectric base cap layer can be from 10 nm to 200 nm, although lesser and greater thicknesses can also be employed. In one embodiment, the dielectric base cap layer includes a dielectric material different from the dielectric materials of the trench isolation structure 42. For example and when the trench isolation structure 42 includes silicon dioxide, the dielectric base cap layer can include silicon nitride.

The stack of the dielectric base cap layer and the extrinsic base layer can be patterned, for example, by applying and lithographically patterning a photoresist layer (not shown) and transferring the pattern in the patterned photoresist layer through the stack of the dielectric base cap layer and the extrinsic base layer. A remaining portion of the extrinsic base layer constitutes the extrinsic base region 54, and a remaining portion of the dielectric base cap layer constitutes the dielectric base cap 56. The transfer of the pattern from the patterned photoresist layer to the stack of the dielectric base cap layer and the extrinsic base layer can be effected by an anisotropic etch. The sidewalls of the extrinsic base region 54 can be substantially vertically coincident with sidewalls of the dielectric base cap 56. The patterned photoresist layer can be subsequently removed, for example, by oxygen ashing.

The dielectric spacer 58 can be formed on sidewalls of the extrinsic base region 54 and the dielectric base cap 56 and on portions of the top surface of the epitaxial germanium portion 30P that are proximal to the sidewalls of the extrinsic base region 52. The dielectric spacer 58 includes a dielectric material such as silicon oxide, silicon nitride, silicon oxynitride, organosilicate glass, or any dielectric material that can be employed to form a spacer as known in the art. In one embodiment, the material of the dielectric spacer 58 is selected to be different from the dielectric material of the dielectric base cap 56 so that the material of the dielectric base cap 58 can be removed selective to the material of the dielectric spacer 58 in later processes.

The dielectric spacer 58 can be formed, for example, by conformal deposition of a dielectric material layer (not shown) followed by an anisotropic etch that removes the horizontal portions of the deposited dielectric material layer. The dielectric material layer can be deposited on sidewalls of the extrinsic base region 54, a top surface and sidewalls of the dielectric base cap and top surfaces of the epitaxial germanium portion 30P and trench isolation structures 42. The conformal deposition of the dielectric material layer can be performed, for example, by CVD, ALD, or a combination thereof. The horizontal portions of the dielectric material layer can be removed by an anisotropic etch. A remaining portion of the dielectric material layer is the dielectric spacer 58. The thickness of the dielectric spacer 58, as measured at the base that contact the epitaxial germanium portion 30P, can be from 10 nm to 300 nm, although lesser and greater thicknesses can also be employed. The dielectric spacer 58 is of unitary construction (in a single piece), and laterally contacts the sidewalls of the extrinsic base region 54 and the dielectric base cap 58.

Regions having a doping of the second conductivity type (i.e., the emitter region 52E and the collector region 52C) are formed in the epitaxial germanium portion 30P, for example, by ion implantation of dopants of the second conductivity type. Specifically, dopants of the second conductivity type are introduced into regions of the epitaxial germanium portion 30P that are not covered by the stack of the extrinsic base region 54 and the dielectric base cap 56. The second conductivity type is the opposite of the first conductivity type. If the first conductivity type is p-type, the second conductivity type is n-type, and vice versa. The dopants of the second conductivity type can be introduced, for example, by ion implantation employing the stack of the extrinsic base region 54 and the dielectric base cap 56 as an implantation mask.

The emitter region 52E and the collector region 52C are formed in the implanted regions of the epitaxial germanium portion 30P. A remaining region of the epitaxial germanium portion 30P that is not implanted with dopants of the second conductivity constitutes the intrinsic base region 52B that laterally contacts the emitter region 52E and the collector region 52C. The intrinsic base region 52B has a doping of the first conductivity type. The extrinsic base region 54 vertically contacts the intrinsic base region 52B.

Dopants in the doped regions of the lateral bipolar transistor including the intrinsic base region 52B, the emitter region 52E, the collector region 52C and the extrinsic base region 54 may be subsequently activated by a rapid thermal anneal such as, for example, a laser anneal.

In one embodiment, the emitter region 52E and the collector region 52C can have a same dopant concentration of dopants of the second conductivity type. The net dopant concentration of dopants of the second conductivity type, i.e., the concentration of the dopants of the second conductivity type less the concentration of dopants of the first conductivity type, in the emitter region 52E and the collector region 52C can be, for example, from $5\times10^{19}$ atoms/cm$^3$ to $5\times10^{21}$ atoms/cm$^3$, although lesser and greater dopant concentrations can also be employed. In another embodiment, a masking layer (not shown) can be employed to provide asymmetric net dopant concentration of dopants of the second conductivity type across the emitter region 52E and the collector region 52C. As used herein, the type of doping in any semiconductor region is determined by the conductivity type of the net dopant concentration.

In the present application, by forming a passivation layer 40 between the epitaxial germanium portion 30P and the buried insulator layer 20 to reduce interface defects at the germanium/insulator interface, the germanium-based lateral bipolar transistor exhibits high drive current and high current gain at a low base-emitter voltage ($V_{BE}$) compared to a germanium-based lateral bipolar transistor formed employing a conventional GOI substrate comprising a germanium layer formed directly on an insulator layer.

Figure 9:
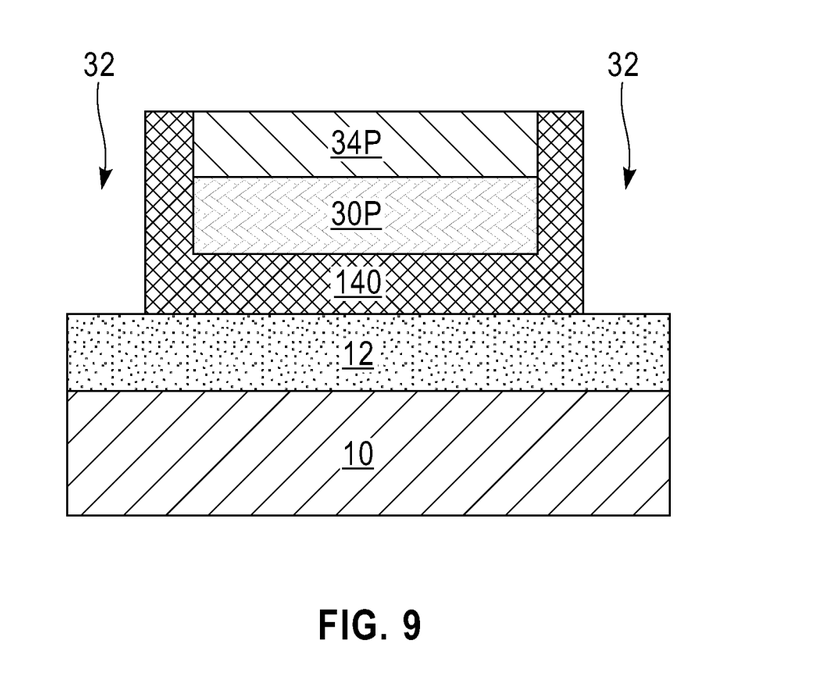
FIG. 9 is a vertical cross-sectional view of a variation of the exemplary semiconductor structure of FIG. 6 after forming the passivation layer by oxidation of germanium in the epitaxial germanium portion.

Referring to FIG. 9, a variation of the exemplary semiconductor structure is shown, in which the passivation layer composed of germanium dioxide, designated as 140, is formed between the epitaxial germanium portion 30P and the buried insulator layer 12 to improve interface characteristics. The passivation layer 140 can be formed by oxidation of exposed surface portions (i.e. sidewalls and a bottom surface) of the epitaxial germanium portion 30P utilizing an oxidation process such as, for example, thermal oxidation, ozone oxidation or plasma-based oxidation. The oxidation of germanium in the epitaxial germanium portion 30P forms germanium dioxide to completely fill the space 36 formed by the removal of the doped germanium portion 20P. In some embodiments of the present application, portions of the passivation layer 140 that are present on the sidewalls of the epitaxial germanium portion 30P may be removed before formation of the trench isolation structure 42.

Figure 10:
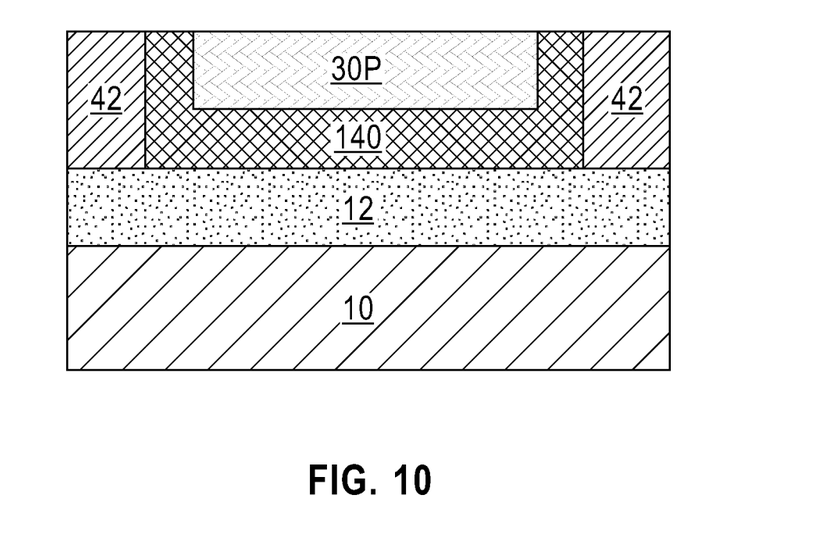
FIG. 10 is a vertical cross-sectional view of the exemplary semiconductor structure of FIG. 9 after forming the trench isolation structure and removing the hard mask portion.

Referring to FIG. 10, processing steps of FIG. 7 can be performed to remove the hard mask portion 34P from the top surface of the epitaxial germanium portion 30P and to form the trench isolation structure 42 within a remaining volume of the trench 32. The trench isolation structure 42 laterally surrounds portions of the passivation layer 140 that are present on the sidewalls of the epitaxial germanium portion 30P.

Next, processing steps of FIG. 8 can be performed to form the lateral bipolar transistor in the epitaxial germanium portion 30P While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:
1. A semiconductor structure comprising:
   a passivation layer located on an insulator layer;
   an epitaxial germanium portion located on the passivation layer and including an intrinsic base region comprising dopants of a first conductivity type, an emitter region laterally contacting a first side of the intrinsic base region and comprising dopants of a second conductivity type that is the opposite type of the first conductivity type, and a collector region laterally contacting a second side of the intrinsic base region opposite the first side and comprising dopants of the second conductivity type;

an extrinsic base region vertically contacting the intrinsic base region and comprising dopants of the first conductivity type; and a trench isolation structure laterally surrounding the passivation layer and the doped epitaxial germanium portion.

2. The semiconductor structure of claim 1, wherein the passivation layer comprises aluminum oxide, silicon dioxide, silicon nitride, silicon oxynitride, tantalum oxynitride, aluminum nitride, hafnium oxide, hafnium nitride, or germanium oxide.

3. The semiconductor structure of claim 1, wherein an entirety of the passivation layer contacts a bottom surface of the epitaxial germanium portion.

4. The semiconductor structure of claim 1, further comprising a dielectric spacer located on sidewalls of the extrinsic base region.

5. The semiconductor structure of claim 1, further comprising a dielectric base cap located on the extrinsic base region.

6. The semiconductor structure of claim 1, wherein the extrinsic base region comprises doped silicon, a doped silicon-germanium alloy, a doped silicon-carbon alloy, or a doped silicon-germanium-carbon alloy.

7. The semiconductor structure of claim 1, wherein the extrinsic base region has a dopant concentration greater than a dopant concentration of the intrinsic base region.

8. The semiconductor structure of claim 1, wherein the epitaxial germanium portion comprises single crystalline germanium.

9. A semiconductor structure comprising:

a passivation layer located on an insulator layer;

an epitaxial germanium portion located on the passivation layer and including an intrinsic base region comprising dopants of a first conductivity type, an emitter region laterally contacting a first side of the intrinsic base region and comprising dopants of a second conductivity type that is the opposite type of the first conductivity type, and a collector region laterally contacting a second side of the intrinsic base region opposite the first side and comprising dopants of the second conductivity type; and an extrinsic base region vertically contacting the intrinsic base region and comprising dopants of the first conductivity type, wherein the passivation layer contacts sidewalls and a bottom surface of the epitaxial germanium portion.

10. A method of forming a semiconductor structure comprising:

providing a germanium-on-insulator (GOI) substrate comprising, from bottom to top, a handle substrate, a buried insulator layer and a doped germanium layer;

forming an epitaxial germanium layer on the doped germanium layer;

forming a trench extending through the epitaxial germanium layer and the doped germanium layer, the trench exposing sidewalls of a doped germanium portion and an epitaxial germanium portion;

removing the doped germanium portion, wherein a space is formed between the epitaxial germanium portion and the buried insulator layer; and forming a passivation layer to fill the space.

11. The method of claim 10, wherein the passivation layer comprises aluminum oxide, silicon dioxide, silicon nitride, silicon oxynitride, tantalum oxynitride, aluminum nitride, hafnium nitride, or germanium oxide.

12. The method of claim 10, further comprising:

forming a hard mask layer on a top surface of the epitaxial germanium layer;

patterning the hard mask layer to provide a hard mask portion; and patterning the epitaxial germanium layer and the doped germanium layer using the hard mask portion as an etch mask, wherein the trench exposes sidewalls of the hard mask portion.

13. The method of claim 12, further comprising filling the trench with a dielectric material to provide an isolation structure.

14. The method of claim 13, further comprising removing the hard mask portion from a top surface of the epitaxial germanium portion.

15. The method of claim 10, wherein the forming the passivation layer is performed by atomic layer deposition or chemical vapor deposition.

16. The method of claim 10, wherein the forming the passivation layer is performed by oxidation of portions of the epitaxial germanium layer exposed by the space and the trench.

17. The method of claim 10, wherein the passivation layer has a same thickness as the doped germanium portion.

18. The method of claim 10, further comprising forming an intrinsic base region comprising dopants of a first conductivity type and regions comprising dopants of a second conductivity that is the opposite type of the first conductivity type in the epitaxial germanium portion and forming an extrinsic base region comprising dopants of the first conductivity type overlying the base region.

19. The method of claim 18, further comprising forming a dielectric spacer on sidewalls of the extrinsic base region.

\* \* \* \* \*